United States Patent [19]
Topp et al.

[11] Patent Number: 5,523,714
[45] Date of Patent: Jun. 4, 1996

[54] MONOLITHICALLY INTEGRATED MOS OUTPUT-STAGE COMPONENT WITH OVERLOAD-PROTECTION MEANS

[75] Inventors: Rainer Topp; Manfred Uebele, both of Reutlingen, Germany

[73] Assignee: Robert Bosch GmbH, Stuttgart, Germany

[21] Appl. No.: 256,213

[22] PCT Filed: Oct. 7, 1993

[86] PCT No.: PCT/DE93/00949

§ 371 Date: Jun. 24, 1994

§ 102(e) Date: Jun. 24, 1994

[87] PCT Pub. No.: WO94/10753

PCT Pub. Date: May 11, 1994

[30] Foreign Application Priority Data

Oct. 28, 1992 [DE] Germany ............... 42 36 334.9

[51] Int. Cl.[6] .................. H03K 17/687; H03K 3/42; H03K 5/08
[52] U.S. Cl. .................. 327/427; 327/434; 327/513; 327/309; 327/328
[58] Field of Search .................. 327/427, 512, 327/513, 387, 389, 108, 306, 309, 378, 434, 328; 361/90, 91

[56] References Cited

U.S. PATENT DOCUMENTS

| | | | |
|---|---|---|---|
| 4,893,158 | 1/1990 | Mihara et al. | 361/91 |
| 4,896,199 | 1/1990 | Tsuzuki et al. | 327/512 |
| 4,926,283 | 5/1990 | Qualich | 327/512 |
| 5,272,399 | 12/1993 | Tihanyi et al. | 327/108 |
| 5,352,932 | 10/1994 | Tihanyi | 327/108 |

FOREIGN PATENT DOCUMENTS

| | | |
|---|---|---|
| 0384937 | 9/1990 | European Pat. Off. . |
| 0428813 | 5/1991 | European Pat. Off. . |
| 3433538 | 3/1986 | Germany . |
| 3821065 | 1/1989 | Germany . |
| 2226808 | 9/1990 | Japan . |

*Primary Examiner*—Timothy P. Callahan
*Assistant Examiner*—Trong Phan
*Attorney, Agent, or Firm*—Kenyon & Kenyon

[57] ABSTRACT

A monolithically integrated MOS output-stage component is proposed which is provided with an output-stage element (10) having a GATE connection, a SOURCE connection, and a DRAIN connection, and having an overload-protection device. An integrated GATE series resistor (11) is provided which connects an outer GATE connection (Ga) of the output-stage component with the GATE connection (Gi) of the output-stage element (10). The overload-protection device is integrated in the output-stage component and has a level matching stage (30) which, by a defined flow through the GATE series resistor (11), effects a displacement of the transmission characteristic of the output-stage element (10) by a defined voltage offset value. Furthermore, a limiting stage (34) is provided which limits the sum value of the DRAIN-SOURCE voltage and a voltage proportional to the DRAIN current to a determinable value. In this way, an overload-protection device in monolithically integrated form is obtained at favorable cost with improved protective function, in which connection the physical limits of the semiconductor can be more strongly utilized.

15 Claims, 4 Drawing Sheets

MONOLITHICALLY INTEGRATED MOS OUTPUT-STAGE COMPONENT WITH OVERLOAD-PROTECTION MEANS

BACKGROUND OF THE INVENTION

The present invention relates to a monolithically integrated MOS output-stage component, particularly a DMOS output stage, having an output-stage element with a GATE connection, A SOURCE connection and a DRAIN connection, and having an overload-protection device.

Overload-protection devices are known in various discrete circuit variants. In this connection, specific adaptation to the specific output-stage component requires a significant expense and the physical limits of the semiconductor can only be utilized to a limited extent.

SUMMARY OF THE INVENTION

A MOS output-stage component according to the present invention has the advantage of being inexpensive to produce as a result of a monolithically integrated solution with improved protective function and greater utilization of the physical limits of the semiconductor. As a result of the level adaptation stage, there is a sufficiently high supply voltage available for the dependable operation of the overload or power limitation in order to limit the loss power to a value of zero. The input voltage (GATE-SOURCE voltage of the output-stage component) or the sense current from a sense cell of the output-stage component can be utilized as measurement value for the output or DRAIN current Id. The level adaptation may be effected by balancing, in the manner that the control characteristic Id=f (Ugs) has a negative temperature coefficient and limits, while stabilizing, the output current upon an increase in the temperature of the chip. This can be effected, for instance, by suitable selection of the temperature coefficient of a source of reference voltage or by suitable combination of the resistor temperature coefficients of the resistors involved.

The level adaptation stage is advantageously developed as a current level, the first branch of which connects the GATE connection of the output-stage component with the SOURCE connection and the second branch of which is acted on by a reference current. For this purpose, a source of reference current is connected to this second branch, it being fed from the outer GATE connection. In this way, the integrated GATE series resistor is controlled with a defined flow and the level adaptation formed thereby shifts the transmission characteristic of the output stage by a defined voltage offset value and increases the external threshold value of the output stage. In other words, no output current below this value flows in the output stage. At the same time, the fixed association Ugs=f (Id) is produced, so that the input voltage Ugs can be used as measurement value for the output current Id flowing.

The loss power which is to be monitored amounts to P=Uds·Id. It could be exactly determined with an analog multiplier, but this is very expensive and scarcely possible in integrated form. For the limit conditions existing here in combination with the level adaption stage, an adder stage which additively connects the DRAIN-SOURCE voltage to the GATE-SOURCE voltage is sufficient to produce a good approximate solution for the multiplication and formation of the power or load to be limited in a manner which is very simple from a circuit standpoint. For this purpose, the adder stage includes two resistors which are connected on one side to each other and over which the two voltages are brought together at a summation point.

As an alternative to the voltage Ugs, there can also be used as measure of the DRAIN current that voltage which produces a sense current Is=Id/k which flows through sense cells in the SOURCE region of the output-stage element by flow into the summation point of the control circuit.

In order to reduce the power when necessary, the limiting stage has means for reducing the resistance of a MOS transistor connected between the outer GATE connection and the SOURCE connection upon an increase in the sum value of the adder stage. In this way, the control potential is reduced until the sum voltage which is proportional to the power agrees with a reference value.

The means contained in the limiting stage can be developed in a simple manner as a comparative control amplifier to which a determinable limit value is fed as a reference value in addition to the sum value. This means can, however, also be developed as multi-stage MOS control amplifier which is controlled by means of a voltage divider by a determinable part of the sum value.

In addition, a DRAIN-SOURCE voltage limiter (clamping) can also be provided for the output-stage element for protection against impermissibly high voltages upon the disconnecting of inductive loads.

Furthermore, an excess-temperature protective device can also be integrated in the output-stage component so that the threshold for the load limitation need only be moderately exact, while the excess-temperature protection device reduces the actual loss power to such an extent that the temperature of the chip does not rise above a predetermined limit.

The balancing of the level adaptation and a negative temperature coefficient of the output current Id with constant input voltage permit, in simple manner, a module-like parallel connection of several output-stage components. In this way, the maximum output current Id can be increased, the modular construction permitting a low effective heat resistance due to the divided loss power. The chip having the lowest clamping voltage also controls the parallel-controlled chips. A balancing of the clamping voltage on the basis of dispersions of the component parameters from different manufacturing batches is not necessary. The level adaptation is so balanced that components from different manufacturing batches have the same characteristic (the same operating point).

DETAILED DESCRIPTION OF THE INVENTION

Figure 1:
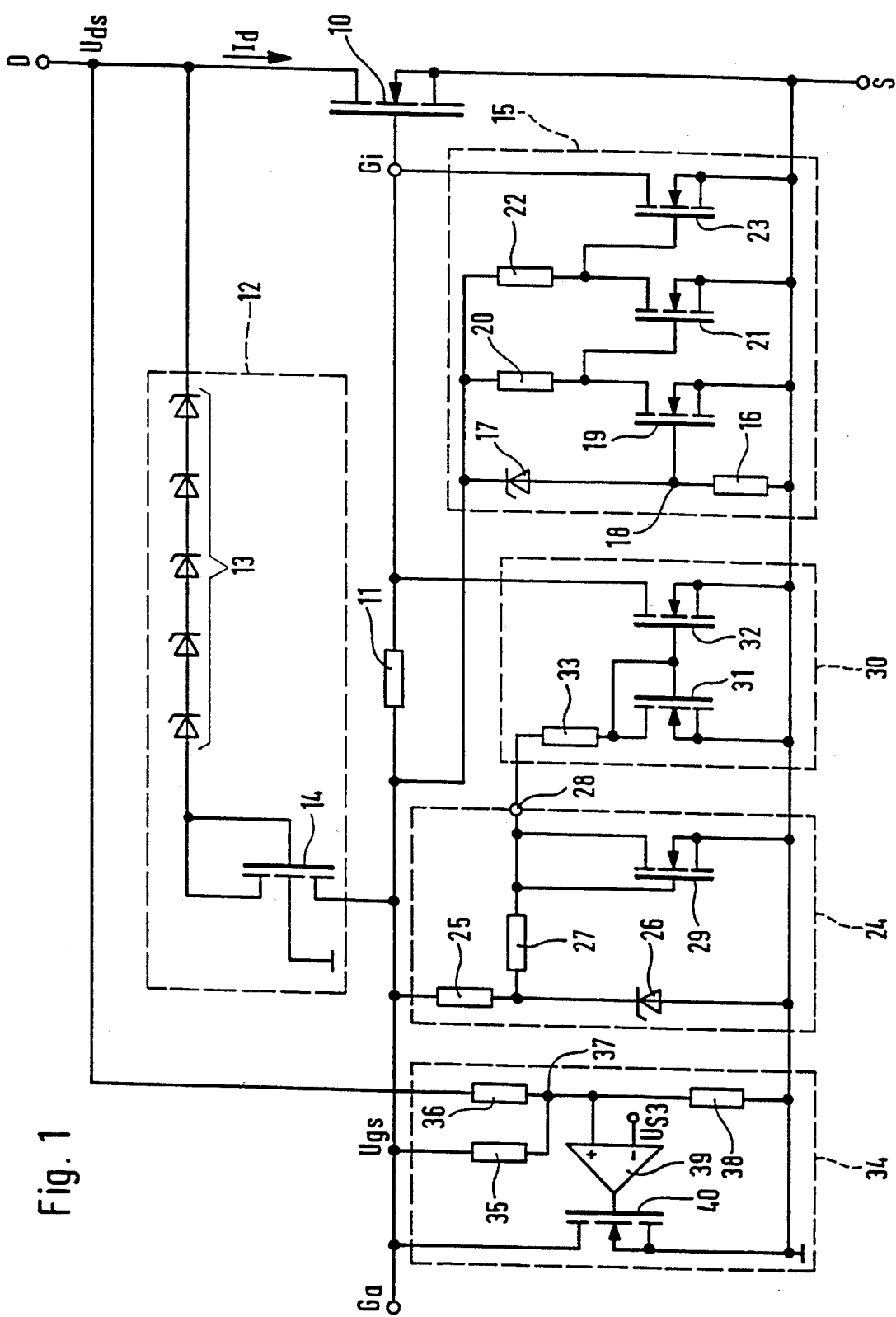
FIG. 1 is an overall circuit diagram of a monolithically integrated MOS output-stage component with a first embodiment of an excess temperature protection device for the controlling of the output current.

FIG. 1 shows a monolithically integrated MOS output-stage component which is formed, for example, as DMOS output stage. It includes an output-stage element 10 developed as MOS-npn-transistor as controllable semiconductor element. This output-stage element 10 has, in known manner, a DRAIN connection D, a SOURCE connection S, and a GATE connection Gi. A GATE series resistor 11 is connected in front of the GATE connection Gi the terminal of said resistor which faces away from the output-stage element forming the outer GATE connection Ga of the entire output-stage component. Between the DRAIN connection D and the outer GATE connection Ga, there is connected a DRAIN-SOURCE voltage limiter 12 which is referred to in customary manner also as clamping. This voltage limiter 12 consists essentially of the series connection of a plurality of Z-diodes 13 (zener diode) with an MOS transistor 14 which is connected as diode and the SOURCE connection of which is connected to the outer GATE connection Ga of the entire output-stage component while its BULK connection is connected to ground or to the SOURCE connection of the entire output-stage component. The number of Z-diodes 13 depends on the maximum permissible voltage desired. If this voltage is exceeded, for instance upon the disconnecting of inductive loads, a further increase in the DRAIN voltage is prevented by the flow of current through these Z-diodes.

An excess-temperature protection device 15 includes a series connection of temperature-dependent resistor 16 with a Z-diode 17, the temperature-dependent resistor 16 having a positive temperature coefficient. This series connection is connected between the outer GATE connection Ga and the SOURCE connection S of the output-stage component, the resistor 16 being connected to the SOURCE connection and the Z-diode 17 to the outer GATE connection Ga. A tap 18 of this voltage divider which lies between the resistor 16 and the Z-diode 17 is connected to the GATE connection of an MOS transistor 19 the DRAIN-SOURCE path of which is connected in series with a resistor 20 between the outer GATE connection Ga and the SOURCE connection S of the output-stage component. The resistor 20 is connected to the outer GATE connection Ga. The junction between the resistor 20 and the MOS transistor 19 is connected to the GATE connection of another MOS transistor 21 which forms a corresponding series connection with a resistor 22. The tap between the resistor 22 and the MOS transistor 21 is connected to the GATE connection of a third MOS transistor 23, the DRAIN-SOURCE path of which is connected between the inner GATE connection Gi and the SOURCE connection S of the output-stage component. The excess-temperature protection device 15 is connected in the embodiment shown with the outer GATE connection Ga for the current supply. As an alternative to this, a source of reference voltage which is developed, for instance, in accordance with the source of reference voltage 24 in FIG. 1 can also, of course, be employed for the voltage supply.

The Z-diode 17 forming a temperature-sensitive element has a very high sensitivity. Its inverse current doubles upon every increase in temperature by 10° K. At the same time, upon an increase in temperature, the resistance of the temperature-dependent resistor 16 increases so that, upon an increase in temperature, the current through this series circuit rises steeply and thus also the voltage at the tap 18. The MOS transistor 19 also represents a temperature-dependent component which, upon an increase in temperature, responds already at lower voltages. In this way, by the cooperation of these components there is obtained as a whole a high total slope for the output signal and a slight temperature fuzziness in the event of production-produced dispersion of the parameters of the components. The desired temperature switch point or starting point of the temperature control can be determined by balancing this resistor 16 or by corresponding selection of its resistance. In the event of average accuracy requirements, an exact balancing can be dispensed with.

Upon an increase in the chip temperature, the control voltage on the tap 18 thus increases, which results in increased current through the MOS transistor 19, corresponding to a reduced flow the MOS transistor 21 and accordingly an increased current through the MOS transistor 23. In this way, upon increase in the chip temperature, the GATE voltage at the inner GATE connection Gi is reduced until thermal equilibrium is obtained.

In the source of reference voltage 24, the series connection of a resistor 25 with a Z-diode 26 is connected between the outer GATE connection Ga and the SOURCE connection S, the Z-diode 26 being connected to the SOURCE connection S. The junction point between these two components is connected via a resistor 27 to an output 28 of the source of reference voltage 24. Between the output 28 and the SOURCE connection of the output stage element 10 there is connected the DRAIN-SOURCE path of an MOS transistor 29 the GATE connection of which is also connected to the output 28.

In operation, the Z-voltage is present at the cathode of the Z-diode 26. Upon an increase in voltage, the MOS transistor 29 is driven more strongly so that the output voltage of the source of reference voltage 24 is brought to a constant value.

A level adaptation stage 30 developed as current mirror has two MOS transistors 31, 32 in a current-mirror circuit, i.e. the two GATE connections are connected to each other and the two SOURCE connections are connected to the SOURCE connection of the output-stage component. The DRAIN connection of the MOS transistor 31 is connected to the two GATE connections and, via a resistor 33, to the output 28 of the reference voltage source 24. The DRAIN connection of the MOS transistor 32 is connected to the inner GATE connection Gi of the output-stage element 10.

As a result of the fixed reference voltage at the output 28, a constant current flows through the left-hand branch of the level adaptation stage 30 and therefore through the MOS transistor 31, so that a constant current also flows through the MOS transistor 32 as a result of the current mirror. In this way, there is obtained a defined flow through the GATE series resistor 11 and the level adaptation formed thereby displaces the transmission characteristic of the output stage by a specific voltage offset value and increases the external threshold voltage of the output stage; i.e. below this value no output current flows to the output-stage element 10. At the same time, there is produced hereby a firm association of the DRAIN current Id with the external GATE-SOURCE voltage Ugs at the external GATE connection Ga, which is fixed via a balancing. The input voltage Ugs can now be used as measurement value for the flowing output current Id of the output-stage component. In this connection, the level adaptation is so selected that the control characteristic Id=f (Ugs) has a negative temperature coefficient and limits the output current, stabilizing it, upon increase of the chip temperature. This can take place, for instance, by suitable selection of the temperature coefficient of the reference voltage at the output 28 or by suitable combination of the temperature coefficients of the resistors 33 and 11.

In a limiting stage 34, the voltages Ugs on the outer GATE connection Ga and the DRAIN-SOURCE voltage Uds on the DRAIN connection D of the output-stage element 10 are brought together via two resistors 35, 36 at a summation point 37 which is connected via another resistor 38 to the SOURCE connection S of the output-stage element 10. The totalled voltage at the summation point 37 are fed to the non-inverting input of a comparative control amplifier 39 on the comparison input of which there is a comparison voltage $U_{S3}$. The control amplifier 39 controls the GATE connection of an MOS transistor 40 the DRAIN-SOURCE path of which is connected between the outer GATE connection Ga and the SOURCE connection S of the output-stage element 10.

The information as to the value of the DRAIN current Id, instead of being fed via the resistor 35, can be fed to the control circuit by a sense current from the output-stage element 10 which flows into the summation point 37 of the control stage or limiting stage 34. This alternative will be explained further in connection with FIG. 6.

The loss power of the output-stage element 10 amounts to Uds·Id. It could be exactly determined by an analog multiplier, but this is very expensive and scarcely feasible in integrated form. As a result of the level adaptation stage 30, the voltage Ugs, however, is proportional to the current Id. For the limit conditions given here (analog operation) the approximate solution for the loss power P is $$P = k_1 \cdot Uds + k_2 \cdot Ugs$$

This addition is effected by the two resistors 35, 36 so that at the summation point 37 a voltage value which is dependent on the loss power P is present. By the control amplifier 39, the loss power is to be limited to the value $U_{S3}$, i.e. if the voltage value at the summation point 37 which is dependent on the loss power exceeds the value $U_{S3}$, the MOS transistor 40 is driven, which results in a reduction in the voltage Ugs on the outer GATE connection Ga. In this way, there is a limitation of power and protection against overload of the output-stage element 10. At the limit regions, i.e. in the case of very small values of Uds and Id, there is a stronger limitation of the loss power due to the addition of Uds and Id.

In this way, the physical limits of the output-stage component or the output-stage element 10 can be more strongly utilized. By the level matching there is available for the dependable operation of the power limitation, a sufficiently high supply voltage in order to limit the loss power to a value of zero. The combination of the power limitation by the limiting stage 34 and the excess-temperature control by the excess-temperature protection device 15 permits a relatively exact threshold for the power limitation, while the excess-temperature control reduces the actual loss power to such an extent that the chip temperature cannot rise above a predetermined limit. The balancing of the level matching to an identical control characteristic, on the one hand, and a negative temperature coefficient of the output current Id with constant input voltage, on the other hand, permit an easy connection in parallel of several output-stage components or chips. The chip having the lowest clamping voltage also serves to control the parallel-connected chips. A balancing of the clamping voltage due to dispersions in the parameters of the components obtained from different manufacturing batches is unnecessary. The adaptation of the level by the level-adaptation stage 30 is effected in the manner that components from different manufacturing batches have the same characteristic (the same operating point). Furthermore, the output current Id, in the case of constant input voltage, is imparted a negative temperature course in order to counteract asymmetries in the output current of different chips. By the connection in parallel of several chips the maximum output current Id can be increased. The modular construction permits a low effective thermal resistance due to the divided loss power.

Figure 2:
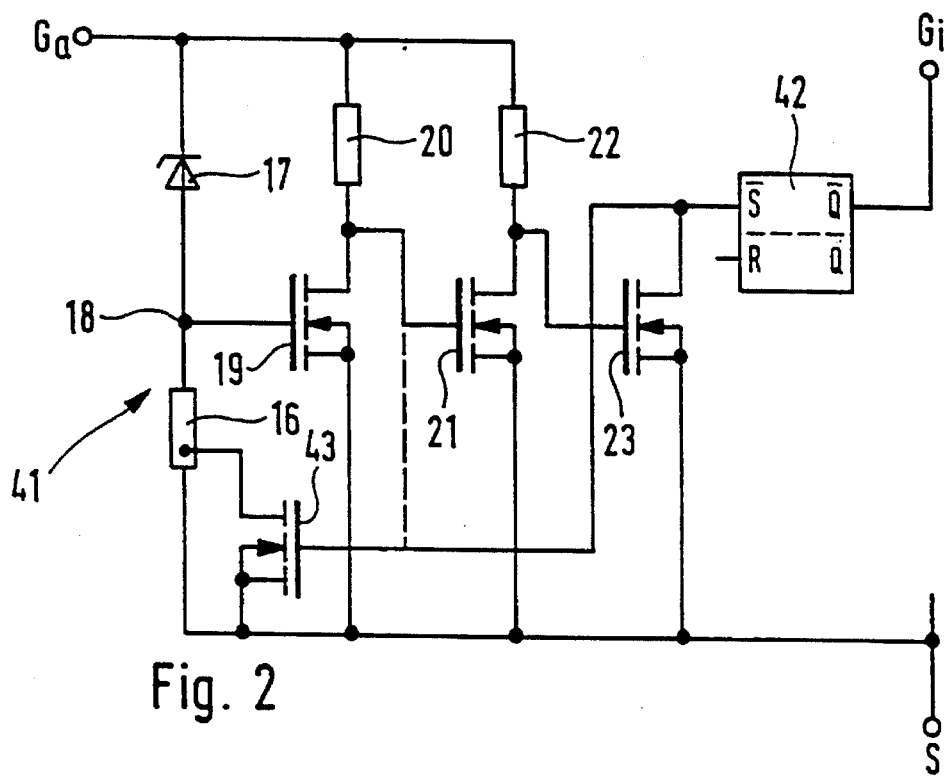
FIG. 2 shows a second embodiment of an excess-temperature protection device with a temperature disconnect.

The excess-temperature protection device 41 shown in FIG. 2 can take the place of the excess-temperature protection device 15 of FIG. 1. Differing from the excess-temperature protection device 15, the DRAIN connection of the MOS transistor 23 is now connected to the setting input $\overline{S}$ of a flip-flop 42 the output $\overline{Q}$ of which is connected to the inner GATE connection Gi of the output stage element 10. Furthermore, a partial region of the temperature-dependent resistor 16 can be short-circuited via the DRAIN-SOURCE path of an MOS transistor 43 the GATE connection of which is connected to the setting input $\overline{S}$ of the flip-flop 42.

This excess-temperature protection device 41 effects an excess-temperature disconnect. If the voltage at the tap 18 increases above a given value, the flip-flop 42 is actuated and connects the inner GATE connection 61 of the output-stage element 10 to ground or to the potential of the SOURCE connection S. In this way, there is a sudden disconnect of the output-stage element 10 as from a given excess temperature. The resetting of the flip-flop 42 for resumption of operation of the output-stage element 10 can be effected either upon the reconnection of a supply voltage or, in time-controlled manner, after a predeterminable time or as a function of the voltage at the tap 18 when the latter has dropped below a given value.

By the MOS transistor 43 a switch hysteresis is produced. With the MOS transistor 23 initially blocked, the MOS transistor 43 conducts, so that a part of the temperature-dependent resistor 16 is short-circuited. At a given chip temperature, the MOS transistor 43 is so driven that the flip-flop 42 switches. By the same signal, the MOS transistor 43 is blocked, so that now the entire resistance of the temperature-dependent resistor 16 is active and the voltage at the tap 18 thereby rises suddenly. In this way, rapid reconnection is prevented and a hysteresis is obtained. This hysteresis can, of course, also be used in an excess-temperature control in accordance with FIG. 1, i.e. even when the flip-flop is not present. The control of the MOS transistor 43 can also be effected by the voltage at the GATE connection of the MOS transistor 21, as indicated by a dashed line.

Figure 3:
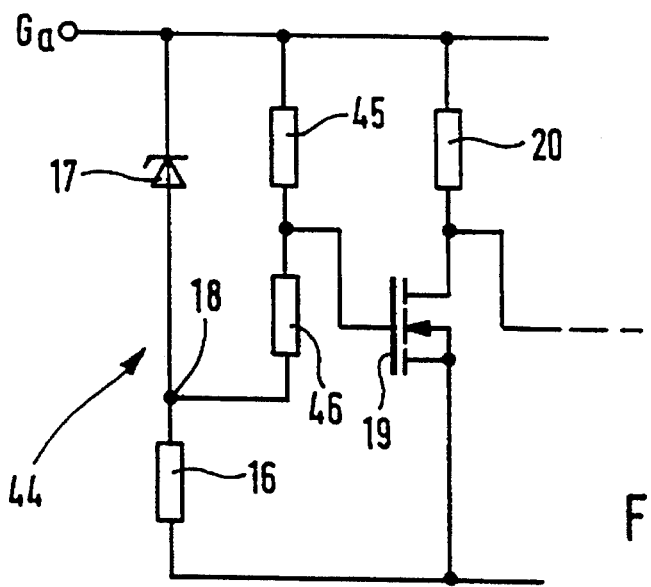
FIG. 3 shows a third embodiment of an excess-temperature protection device.

The further embodiment of an excess-temperature protection device 44 shown in FIG. 3 can also be used instead of the excess-temperature protection device 15. Identical or identically active parts are provided with the same reference numerals and are not described again. Reference is made, for purposes of simplification, to the description of the second and third MOS transistors 21 and 23 which can, of course, also be provided. As a modification of the previous embodiments, a voltage divider consisting of two resistors 45, 46 is now connected in parallel to the Z-diode 17, the tap between the resistors 45, 46 being connected to the GATE connection of the MOS transistor 19.

The anode of the Z-diode 17 represents the base of a parasitic npn-transistor the function of which is not desired. This increase in voltage is reduced by a suitable bias voltage at the GATE connection of the MOS transistor 19 via the voltage divider formed by the resistors 45, 46, 16, so that the sensitivity to response of the transistor arrangement can be increased.

In the further embodiment of an excess-temperature protection device 47 shown in FIG. 4, again identical or identically acting components are provided with the same reference numerals and have not been described again. Instead of the MOS transistor 19 and the resistor 20, there is now employed an amplifier 48, the inverting input of which is connected to the tap 18. The non-inverting input of this amplifier 48 is acted on by a comparison voltage $U_{S1}$. The output of this amplifier 48 controls the MOS transistor 21. Furthermore, the DRAIN-SOURCE path of another MOS transistor 49 is connected in parallel to the temperature-dependent resistor 16. This MOS transistor 49 is controlled via another amplifier 50, the non-inverting input of which is connected to the tap 18 and the inverting input of which is acted on by a comparison voltage $U_{S2}$.

The increase in voltage described at the anode of the Z-diode 17 is limited here by the fact that the evaluation of the signal at the tap 18 is effected via the amplifier 48, the comparison voltage $U_{S1}$ being, for instance, 100–150 mV. This means that the increase in voltage on the anode is limited to this value. The P-tank of the Z-diode 17 can at the same time be used for integration of the other components for the excess-temperature protective circuit. For dependable operation, there is required, in this connection, a limitation of the voltage at the tap 18 to a value of less than 300 mV. This limitation is effected by the second amplifier 50 which, when the comparison voltage $U_{S2}$ of, for instance, 300 mV is exceeded, connects the high ohmic resistor 16 in low-ohmic manner with the ground connection or SOURCE connection. In a simpler development, the amplifier 50 and the MOS transistor 49 can also be dispensed with.

Figure 4:
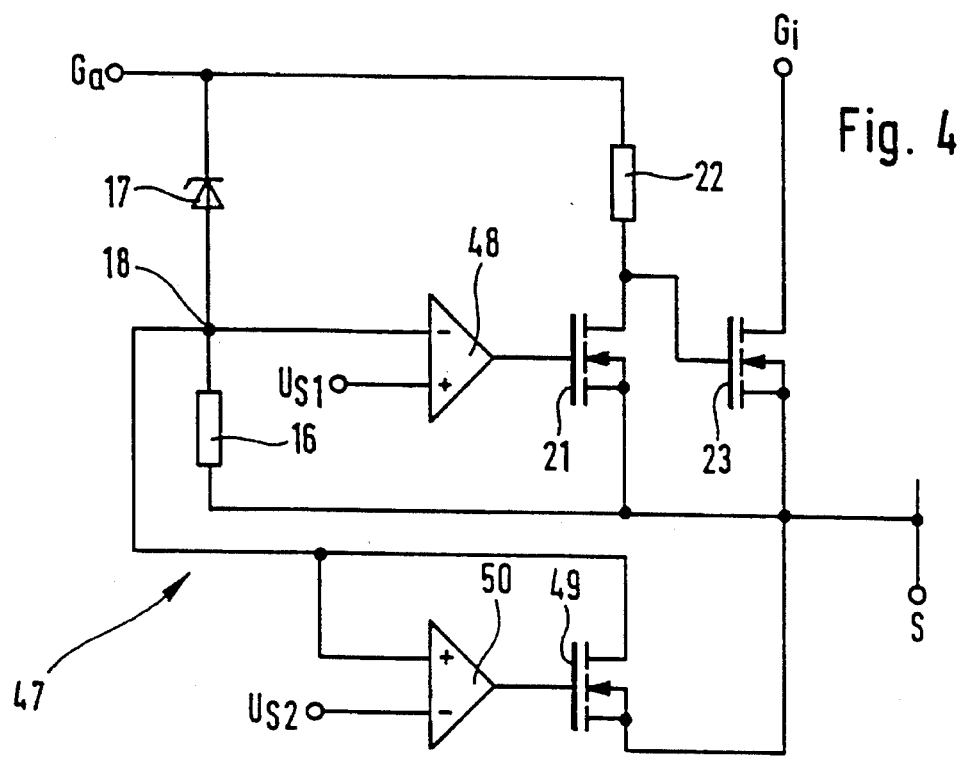
FIG. 4 shows a fourth embodiment of an excess-temperature protection device.

In the embodiments shown in FIGS. 3 and 4, a hysteresis in accordance with FIG. 2 can, of course, also be effected. It is also possible to use this circuit variant for the excess-temperature control or the excess-temperature disconnect.

Figure 5:
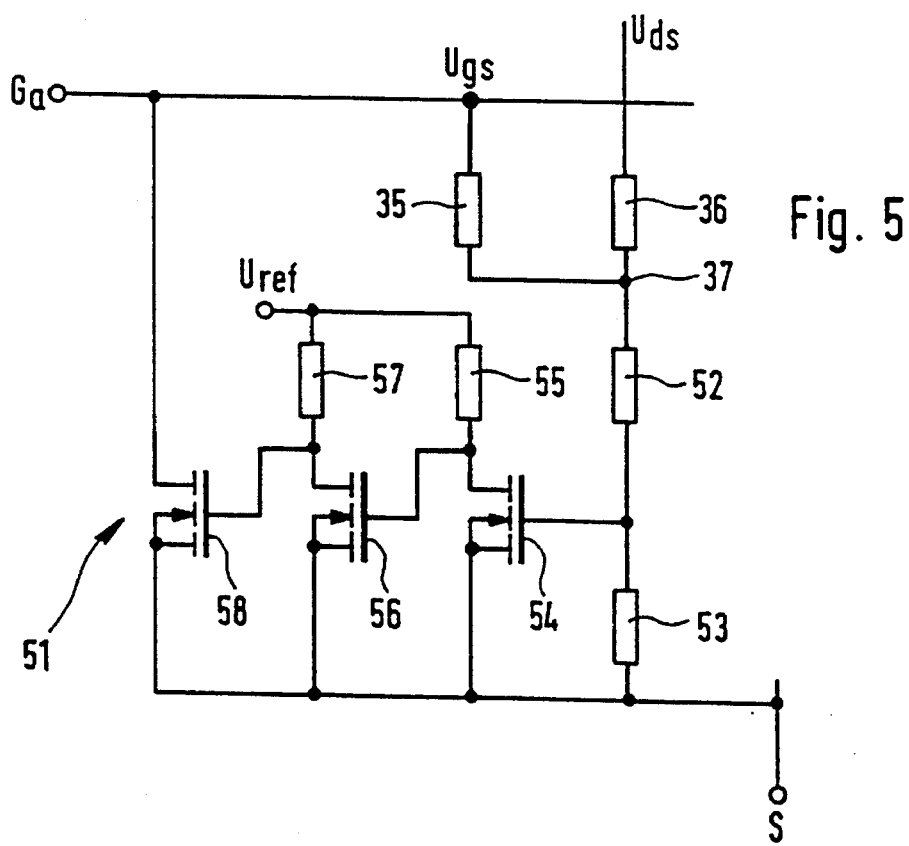
FIG. 5 shows an alternative embodiment of the overload-protection device contained in FIG. 1.

FIG. 5 shows a further embodiment of a limiting stage 51 which can be used instead of the limiting stage 34 in FIG. 1. Identical or identically acting components are provided with the same reference numerals and are not described again.

The summation point 37 in this case is connected via a voltage divider consisting of two resistors 52, 53 to the SOURCE connection of the output-stage element 10. The tap between the resistors 52, 53 controls the GATE connection of an MOS transistor 54 which, together with a resistor 55, forms a series connection which is connected between a source of reference voltage Uref and the SOURCE connection S. The DRAIN connection of this MOS transistor 54 controls a correspondingly connected series connection of an MOS transistor 56 with a resistor 57. The DRAIN connection of the MOS transistor 56 is connected to the GATE connection of another MOS transistor 58 the DRAIN-SOURCE path of which connects the outer GATE connection Ga with the SOURCE connection S of the output-stage element 10.

By the voltage divider consisting of the two resistors 52, 53, the signal at the summation point 37 which is proportional to the loss power is so reduced that it is suitable to control the three-stage transistor arrangement. As from a given voltage value, and therefore from a given value of loss power, the MOS transistor 58 is placed so far in the current-conducting state that the input voltage Ugs and thus the current Id are lowered.

Figure 6:
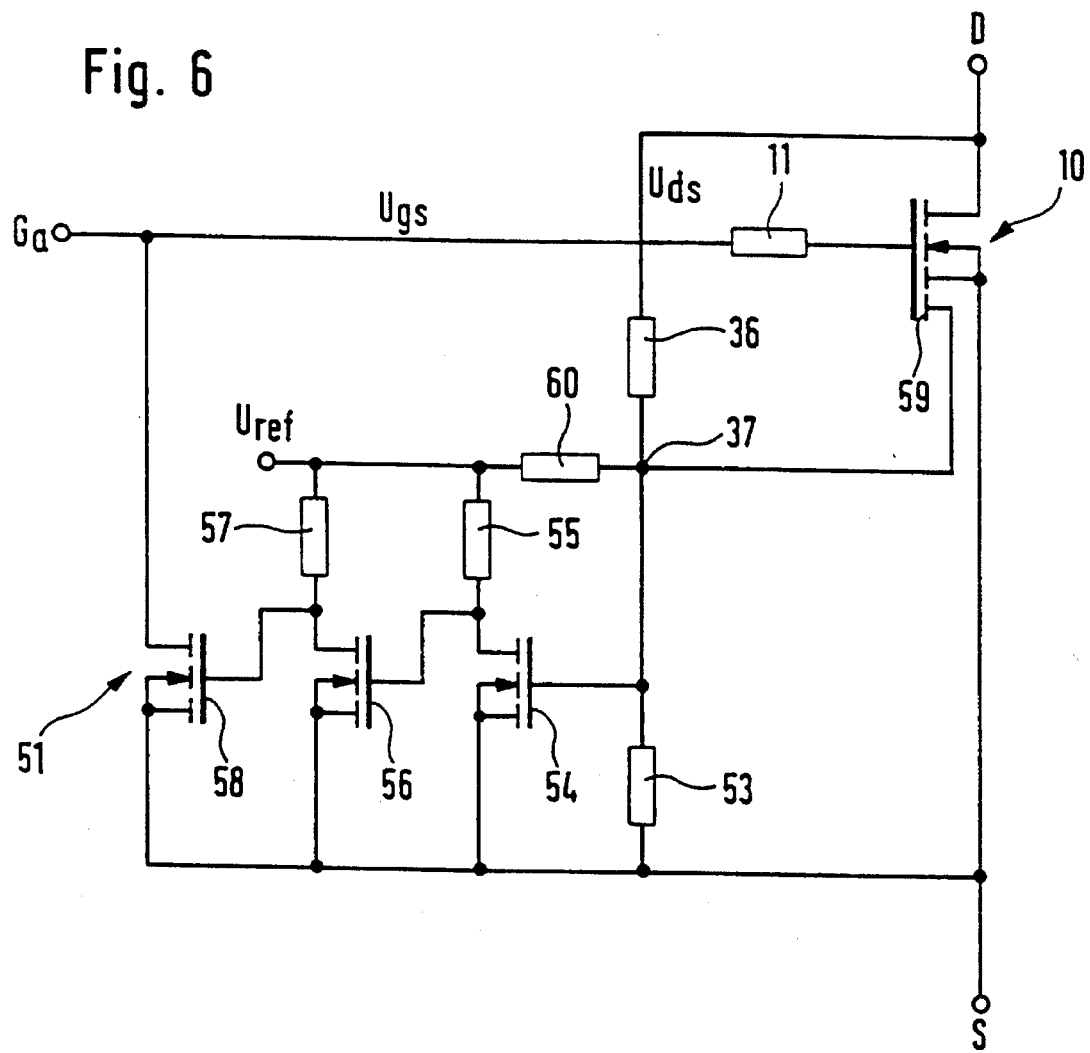
FIG. 6 shows another alternative embodiment of the overload-protection device of FIG. 1.

The alternative circuit to FIG. 5 which is shown in FIG. 6 is of similar construction, identical or identically acting components being provided with the same reference numerals and not being described again. The output-stage element 10 and the GATE series resistor 11 are additionally shown in accordance with FIG. 1. The resistor 35 and the corresponding connection to the outer GATE connection Ga is dispensed with. The output-stage element has an additional sense cell 59 which is connected to the summation point 37. The latter is furthermore acted on by the reference voltage Uref via a resistor 60. The resistor 38 is dispensed with.

As an alternative to the voltage Ugs, there is used here as measure of the DRAIN current Id a voltage which the sense current Is=Id/k flowing into the summation point 37 from the sense cell 59 produces. For the adjusting of the operating point of the control there is used the resistor 60, which is connected to the source of reference voltage.

Of course, the feeding of the sense current to the summation point instead of the voltage Ugs can be used in corresponding manner also in the embodiment in accordance with FIG. 1.

The output-stage component described can, in its different variants which have been shown, be completely monolithically integrated, particularly in the DMOS technique.

What is claimed is:

1. A monolithically integrated MOS output stage component, comprising:

an output stage element having a gate connection, a source connection, and a drain connection, an integrated gate series resistor connecting an outer gate connection of the output stage component to the gate connection of the output stage element;

an overload protection device having a level matching stage and a limiting stage, the level matching stage coupled between the gate and source connections of the output stage element and producing a displacement of a transmission characteristic of the output stage element by a defined voltage offset value via a defined flow through the gate series resistor, the limiting stage coupled between the outer gate connection and the source connection and limiting a sum of a drain-source voltage and a voltage proportional to a drain current to a predetermined value.

2. The monolithically integrated MOS output stage component according to claim 1, wherein the level matching stage includes a current mirror, a first branch of the current mirror connecting the gate connection of the output stage element to the source connection, a second branch of the current mirror being coupled to a reference current source.

3. The monolithically integrated MOS output stage component according to claim 2, wherein a source of reference voltage is connected to the second branch.

4. The monolithically integrated MOS output stage component according to claim 3, wherein the source of reference voltage is fed by the outer gate connection.

5. The monolithically integrated MOS output stage component according to claim 2, wherein the first and second branches of the current mirror are formed by two MOS transistors.

6. The monolithically integrated MOS output stage component according to claim 1, further including an adder stage which additively connects the drain-source voltage with the gate-source voltage to provide the voltage proportional to the drain current.

7. The monolithically integrated MOS output stage component according to claim 6, wherein the adder stage includes two resistors which are each connected on one side to the drain-source and gate-source voltages, respectively, and which are connected on another side to each other at a summation point, whereby the drain-source and gate-source voltages are combined at the summation point.

8. The monolithically integrated MOS output stage component according to claim 1, further comprising an adder stage which additively connects the drain-source voltage with a voltage proportional to a sense current of the output stage element to provide the voltage proportional to the drain current.

9. The monolithically integrated MOS output stage component according to claim 8, wherein the adder stage includes a resistor which is acted on by the gate-source voltage and which is connected to a summation point, the summation point connected to a sense cell of the output stage element.

10. The monolithically integrated MOS output stage component according to claim 1, wherein the limiting stage includes means for reducing a resistance of a MOS transistor as a function of an increase in the sum, the MOS transistor being connected between the outer gate connection and the source connection and the means for reducing a resistance being coupled to the outer gate connection, the drain connection and the source connection.

11. The monolithically integrated MOS output stage component according to claim 10, wherein said means for reducing a resistance include a comparative control amplifier having respective inputs coupled to a determinable limit value and the sum.

12. The monolithically integrated MOS output stage component according to claim 1, wherein the level matching stage develops a control characteristic Id=f (Ugs) with negative temperature coefficients.

13. The monolithically integrated MOS output stage component according to claim 1, further comprising a drain-source voltage limiter for the output stage element.

14. The monolithically integrated MOS output stage component according to claim 1, further comprising an excess-temperature protection device for reducing an actual loss power of the output stage component so that a temperature of the output stage component does not rise above a predetermined limit.

15. The monolithically integrated MOS output stage component according to claim 14, wherein the excess-temperature protection device further includes a series connection of a zener diode with a temperature-dependent resistor of positive temperature coefficient which is connected to the source connection, the series connection coupled to a supply voltage, a semiconductor arrangement controlled by a control voltage at a tap of the series connection reducing the gate voltage upon occurrence of excess temperatures.

* * * * *